(12) United States Patent
Kim et al.

(10) Patent No.: US 9,252,384 B2
(45) Date of Patent: Feb. 2, 2016

(54) ORGANIC LIGHT EMITTING DEVICE INCLUDING AN AUXILIARY ELECTRODE

(71) Applicant: SAMSUNG DISPLAY CO., LTD., Yongin, Gyeonggi-Do (KR)

(72) Inventors: Ki-Seo Kim, Yongin (KR); Dae-Sung Choi, Yongin (KR); Yi-Joon Ahn, Yongin (KR); Won-Sang Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 81 days.

(21) Appl. No.: 14/046,004

(22) Filed: Oct. 4, 2013

(65) Prior Publication Data

US 2014/0361256 A1 Dec. 11, 2014

(30) Foreign Application Priority Data

Jun. 11, 2013 (KR) .................. 10-2013-0066793

(51) Int. Cl.
*H01L 29/08* (2006.01)
*H01L 51/52* (2006.01)

(52) U.S. Cl.
CPC ............ *H01L 51/52* (2013.01); *H01L 51/5212* (2013.01); *H01L 51/5228* (2013.01)

(58) Field of Classification Search
CPC ........................................................ H01L 51/52
USPC ............................................................ 257/40
See application file for complete search history.

(56) References Cited

U.S. PATENT DOCUMENTS

| 7,633,084 B2 | 12/2009 | Kido et al. |
| 7,791,068 B2 | 9/2010 | Meng et al. |
| 2009/0179208 A1* | 7/2009 | Obata et al. ..................... 257/88 |
| 2014/0183502 A1* | 7/2014 | Song et al. ....................... 257/40 |

FOREIGN PATENT DOCUMENTS

| JP | 2007304599 A | * 11/2007 |
| KR | 1020060080446 | 7/2006 |

* cited by examiner

*Primary Examiner* — Ajay K Arora
(74) *Attorney, Agent, or Firm* — F. Chau & Associates, LLC (57) ABSTRACT

An organic light emitting device includes a substrate, a first electrode disposed on the substrate, a first organic layer pattern disposed on the first electrode, an auxiliary electrode pattern alternately disposed with the first organic layer pattern, and including an upper insulation layer, a lower insulation layer, and an auxiliary electrode disposed therebetween, a light emitting layer disposed on the first organic layer pattern and the auxiliary electrode pattern, a second organic layer disposed on the light emitting layer and a second electrode disposed on the second organic layer.

20 Claims, 4 Drawing Sheets

ORGANIC LIGHT EMITTING DEVICE INCLUDING AN AUXILIARY ELECTRODE

CROSS-REFERENCE TO RELATED PATENT APPLICATION

This application claims priority to Korean Patent Application No. 10-2013-0066793, filed on Jun. 11, 2013, the disclosure of which is hereby incorporated by reference herein in its entirety.

1. TECHNICAL FIELD

The present disclosure relates to an organic light emitting device, and more particularly, to an organic light emitting device which includes an auxiliary electrode.

2. DISCUSSION OF THE RELATED ART

An organic light emitting device is a device employing a material which emits light upon application of voltage, and may be beneficial in that it has high brightness, excellent contrast, polychrome, a large view angle, high speed response, and low operating voltage.

The organic light emitting device has a structure where an organic light emitting layer is interposed between an anode and a cathode. Upon application of voltage, holes from the anode and electrons from the cathode are injected into the organic light emitting layer. The injected holes and electrons may cause an electron exchange among neighboring molecules within the organic light emitting layer and move to the opposite electrode. In addition, when an electron and a hole are re-coupled in a certain molecule, a molecule exciton may be formed in a highly excited state. When the molecule exciton returns to a ground state with low energy it may emit its own unique light. The voltage to apply on the anode and the cathode may be limited depending on the material and structure of the organic light emitting device being used, and accordingly, the injection amount and the light emitting amount of a charge carrier of an organic light emitting device may also be limited.

SUMMARY OF THE INVENTION

Exemplary embodiments of the present invention provide an organic light emitting device which can control the amount of a charge carrier without being affected by the material and the structure of the device.

According to an embodiment of the present invention, there is provided an organic light emitting device including: a substrate, a first electrode disposed on the substrate, a first organic layer pattern disposed on the first electrode, an auxiliary electrode pattern, alternately disposed with the first organic layer pattern, and including an upper insulation layer, a lower insulation layer, and an auxiliary electrode disposed therebetween, a light emitting layer disposed on the first organic layer pattern and the auxiliary electrode pattern, a second organic layer disposed on the light emitting layer, and a second electrode disposed on the second organic layer.

The auxiliary electrode pattern may be disposed on the first electrode.

In the auxiliary electrode pattern, the insulation layers are also disposed on the sides of the auxiliary electrode so that the auxiliary electrode is disposed inside the insulation layers.

The second electrode comprises an auxiliary electrode-overlapping electrode which overlaps with the auxiliary electrode pattern and a first organic layer-overlapping electrode which overlaps with the first organic layer pattern, wherein the auxiliary electrode-overlapping electrode and the first organic layer-overlapping electrode are insulated with each other.

The first electrode may form along with the first organic layer pattern a first electrode-a first organic layer pattern, wherein the first electrode-the first organic layer pattern may be alternately disposed with the auxiliary electrode pattern.

The first electrode-the first organic layer pattern and the auxiliary electrode pattern may be disposed on the substrate.

The first electrode may be an anode, and the second electrode may be a cathode. Here, the first organic layer may include at least one selected from the group consisting of a hole transporting layer, a hole injection layer, and a layer having a dual function of hole transporting and hole injection, and the second organic layer may include at least one selected from the group consisting of an electron transporting layer, an electron injection layer, and a layer having a dual function of electron transporting and electron injection.

The first electrode may be a cathode, and the second electrode may be an anode. Here, the first organic layer pattern may include at least one selected from the group consisting of an electron transporting layer, an electron injection layer, and a layer having a dual function of electron transporting and electron injection, and the second organic layer may include at least one selected from the group consisting of a hole transporting layer, a hole injection layer, and a layer having a dual function of hole transporting and hole injection.

According to an embodiment of the present invention, there is provided an organic light emitting device including: a substrate, a first electrode disposed on the substrate, a first organic layer pattern disposed on the first electrode, a light emitting layer disposed on the first organic layer pattern, a second organic layer disposed on the light emitting layer, an auxiliary electrode pattern, alternately disposed with the second organic layer, and including an insulation layer, and an auxiliary electrode disposed therein; and a second electrode disposed on the second organic layer.

The second electrode includes an auxiliary electrode-overlapping electrode which overlaps with the auxiliary electrode pattern and a second organic layer-overlapping electrode which overlaps with the second organic layer, wherein the auxiliary electrode-overlapping electrode and the second organic layer-overlapping electrode are insulated with each other.

The second electrode forms along with the second organic layer a second electrode-a second organic layer, wherein the second electrode-the second organic layer may be alternately disposed with the auxiliary electrode pattern.

The first electrode may be an anode, and the second electrode may be a cathode. Here, the first organic layer pattern may include at least one selected from the group consisting of a hole transporting layer, a hole injection layer, and a layer having a dual function of hole transporting and hole injection, and the second organic layer may include at least one selected from the group consisting of an electron transporting layer, an electron injection layer and a layer having a dual function of electron transporting and electron injection.

The first electrode may be a cathode, and the second electrode may be an anode. Here, the first organic layer may include an electron transporting layer, an electron injection layer or at least two layers thereof, and a layer having the electron transporting and hole injection functions, and the second organic layer may include a hole transporting layer, a hole injection layer, and a layer having a dual function of hole transporting and hole injection or at least two layers thereof.

The insulation layer may include an oxide film or a nitride film of Si, Al, Hf, Ti, Zr, or Ta, poly(methyl methacrylate (PMMA), polyimide (PI), polyvinylpyrrolidone (PVP), polyethersulfone (PES), polystyrene (PS), poly(ester amide) (PEA) or combinations thereof.

The auxiliary electrode may be formed by using, for example, a metal such as Cr, Al, Ag, Au, Ti or Cu, or a conductive polymer such as polyacetylene, polymethylenevinylene, polypyrrole, polyphenylene, polythiophene, poly(3-alkyl-thiophene), or combinations thereof. In addition, the insulation layer and the auxiliary electrode may be comprised of a transparent material, respectively.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS OF THE INVENTION

Reference will now be made in detail to exemplary embodiments, examples of which are illustrated in the accompanying drawings, and like reference numerals refer to like elements throughout. In this regard, exemplary embodiments of the present invention may have different forms and should not be construed as being limited to the descriptions set forth herein.

Figure 1:
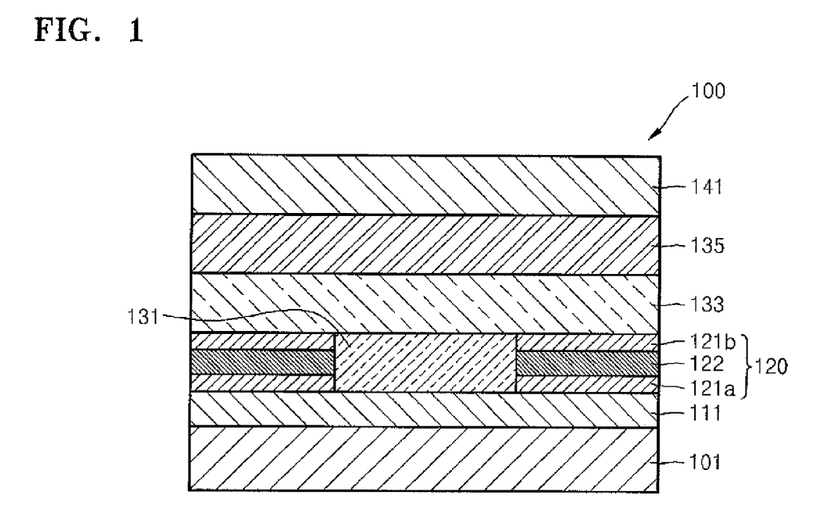
FIG. 1 is a schematic cross-sectional view of an organic light emitting device according to an exemplary embodiment of the present invention.

FIG. 1 is a schematic cross-sectional view of an organic light emitting device 100 according to an exemplary embodiment of the present invention.

An organic light emitting device 100 includes, for example, a substrate 101, a first electrode 111, the first organic layer pattern 131, an auxiliary electrode pattern 120, light emitting layer 133, a second organic layer 135 and a second electrode 141, which are sequentially formed in this order.

The substrate 101 to be used may be, for example, any substrate used in a conventional organic light emitting device. The substrate 101 may be prepared by using, for example, a glass or transparent plastic having excellent mechanical strength, thermal stability, transparency, surface smoothness, easy handlability, and waterproofness. For example, in an embodiment, the substrate 101 may be formed of a plastic material such as polyethyelneterepthalate (PET), polyethylenennapthalate (PEN), polycarbonate (PC), polyallylate, polyetherimide (PEI), polyethersulphone (PES), or polyimide. Alternatively, the substrate 101 may be formed of an opaque material such as, for example, silicon or stainless steel.

The first electrode 111 is formed on top of the substrate 101. The first electrode 111 may be, for example, an anode, or a material with relatively high work function. The first electrode 111 may be formed by using, for example, a transparent conductive oxide, for example, indium tin oxide (ITO), indium zinc oxide (IZO), zinc oxide (ZnO), aluminum-doped zinc oxide (AZO), indium oxide ($In_2O_3$) or tin oxide ($SnO_2$), gallium indium tin oxide (GITO), gallium indium zinc oxide (GIZO), gallium zinc oxide (GZO), and/or fluorine tin oxide (FTO), but exemplary embodiments of the present invention are not limited thereto. The first electrode 111 may be formed via, for example, a deposition method or a sputtering method.

The auxiliary electrode pattern 120 and the first organic layer pattern 131 are, for example, alternately formed on top of the first electrode 111. The auxiliary electrode pattern 120 is formed, for example, in a plurality of patterns which are separated from each other, and the first organic layer pattern 131 is disposed between a plurality of auxiliary electrode patterns 120.

The auxiliary electrode pattern 120 and the first organic layer pattern 131 may be formed via, for example, conventional lithography patterning, imprinting, lift-off process, etc. For example, the first organic layer pattern 131 may be formed by a lift-off method, which includes firstly forming the auxiliary electrode pattern 120, forming an additional layer pattern on an auxiliary electrode 122, and forming a first organic layer on the whole surface of a substrate, and removing the additional layer pattern. Alternatively, the first organic layer pattern 131 may be formed by, for example, vapor deposition using a shadow mask apart from the formation of an auxiliary electrode pattern 120. Additionally, the first organic layer pattern 131 may be formed by, for example, imprinting the first organic layer material by using a mold having a pattern formed thereon.

An auxiliary electrode pattern 120 includes, for example, an auxiliary electrode 122 interposed between an upper insulation layer 121b and a lower insulation layer 121a.

The lower and upper insulation layers 121a and 121b may include, for example, an inorganic material such as an oxide film or a nitride film of silicon (Si), aluminum (Al), hafnium (Hf), titanium (Ti), zirconium (Zr), or tantalum (Ta); an organic material such as poly(methyl methacrylate (PMMA), polyimide (PI), polyvinylpyrrolidone (PVP), polyethersulfone (PES), polystyrene (PS), poly(ester amide) (PEA), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetate cellulose (TAC), and cellulose acetate propionate (CAP), or combinations thereof.

The lower and upper insulation layers 121a and 121b may be formed, for example, by chemical vapor deposition (CVD), plasma-enhanced chemical vapor deposition (PECVD), sputtering, spin coating, imprinting, ink-jet, etc. The lower and upper insulation layers 121a and 121b may have a thickness of, for example, between about 1 nm to about 1 µm, but exemplary embodiments of the present invention are not limited thereto. The lower and upper insulation layers 121a and 121b may increase the insulation property between the auxiliary electrode 122 and the second electrode 141.

For example, the auxiliary electrode 122 may include a transparent conductive oxide such as indium tin oxide (ITO), indium zinc oxide (IZO), zinc oxide (ZnO), aluminum doped zinc oxide (AZO), indium oxide (In$_2$O$_3$), and tin oxide (SnO$_2$), gallium indium tin oxide (GITO), gallium indium zinc oxide (GIZO), gallium zinc oxide (GZO), and/or fluorine tin oxide (FTO); a metal such as lithium (Li), magnesium (Mg), aluminum (Al), aluminum-lithium (Al—Li), calcium (Ca), magnesium-indium (Mg—In), magnesium-silver (Mg—Ag), gold (Au), silver (Ag), plutonium (Pu), and nickel (Ni); a carbon conductive nanotbue such as carbon nanotbue and fullerene, and a semi-conductive material such as silicon (Si), indium phosphide (InP), and gallium nitride (GaN). Here, when the auxiliary electrode 122 is formed by using a metal such as Au, Ag, Pu, and Ni or a semiconductor material, the auxiliary electrode 122 may be prepared in, for example, a nanowire form.

The auxiliary electrode 122 may be formed, for example, via CVD, PECVD, sputtering, spin coating, imprinting, inkjet, etc. The auxiliary electrode 122 may have a thickness of, for example, between about 1 nm to about 1 μm, but exemplary embodiments of the present invention are not limited thereto.

When both the lower and upper insulation layers 121a and 121b and the auxiliary electrode 122 are formed of a transparent material, the blocking of light being emitted from a light emitting layer 133 by the auxiliary electrode 122 can be prevented thus preventing the decrease of an emitting area.

The voltage to be applied on the anode and the cathode may be limited depending on the material and structure of the organic light emitting device being used, and accordingly, the light emitting amount of an organic light emitting device may also be limited. However, in the organic light emitting device 100 according to an embodiment of the present invention, by controlling the voltage of the auxiliary electrode 122, the depletion layer within the first organic layer pattern 131 adjacent the auxiliary electrode 122 may be expanded or reduced, and as a result, the amount of charge carriers (e.g. electrons when the first electrode 111 is a cathode and holes when the first electrode 111 is an anode), which move within the organic light emitting device 100, can be controlled, and accordingly, the light emitting amount of the device can be also controlled.

Furthermore, when a Schottky barrier is formed between the auxiliary electrode 122 and the first organic layer pattern 131 of an organic light emitting device 100, leakage current can be prevented by applying a voltage lower than the threshold voltage of the Schottky barrier to the auxiliary electrode 122, and also by controlling the amount of charge carriers, and consequently the light emitting properties may also be controlled.

When the first electrode 111 is an anode, the first organic layer pattern 131 may include, for example, a pattern of a hole injection layer, a hole transporting layer, a layer having a dual function of hole transporting and hole injection, or at least two layers thereof. The hole injection layer, the hole transporting layer, or the hole functional layer may be formed via, for example, vacuum deposition method, spin coating method, casting method, LB method, etc.

Examples of the compounds to be used in the hole injection layer may include a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino) triphenylamine), TDATA (4,4'4"-tris(N,N-diphenylamino) triphenylamine), 2T-NATA (4,4",4"-tris{N,-(2-naphthyl)-N-phenylamino}-triphenylamine), PEDOT/PSS (poly(3,4-ethylenedioxythiophene)/poly(4-styrenesulfonate)), Pani/DBSA (polyaniline/dodecylbenzenesulfonic acid), Pani/CSA (polyaniline/camphor sulfonicacid) or PANI/PSS (polyaniline)/poly(4-styrenesulfonate)), etc., but exemplary embodiments are not limited thereto. The thickness of the hole injection layer may be, for example, in the range of about 100 Å to about 2,000 Å, but exemplary embodiments are not limited thereto.

Examples of the compounds to be used in the hole transporting layer may include a carbazol derivative such as N-phenylcarbazol, and polyvinylcarbazol, a triphenylamine-based compound such as TPD (N,N'-bis(3-methylphenyl)-N, N'-diphenyl-[1,1-biphenyl]-4,4'-diamine, etc., NPB (N,N'-di (1-naphthyl)-N,N'-diphenylbenzidine, TCTA (4,4',4"-tris(N-carbazolyl)triphenylamine, etc., but exemplary embodiments are not limited thereto. The thickness of the hole transporting layer may be, for example, in the range of about 100 Å to about 2,000 Å, but exemplary embodiments are not limited thereto.

For example, a hole functional layer having a dual function of hole transporting and hole injection may be formed instead of a hole injection layer and a hole transporting layer. The hole functional layer may include, for example, at least one material selected from a hole injection layer material and a hole transporting layer material. The thickness of the hole functional layer may be, for example, in the range of about 100 Å to about 1,000 Å, but exemplary embodiments are not limited thereto.

The auxiliary electrode pattern 120 and the first organic layer pattern 131 may have a height, for example, in the range of about 100 Å to about 3,000 Å, respectively, but exemplary embodiments are not limited thereto.

The light emitting layer (EML) 133 is formed on top of the auxiliary electrode pattern 120 and the first organic layer pattern 131. The light emitting layer 133 may include, for example, at least one material selected from known light emitting materials. The light emitting layer 133 may include, for example, a host and a dopant.

Examples of the host may include tris(8-quinoliate)aluminum (Alq$_3$), CBP (4,4'-bis(N-carbazolyl)-1,1'-biphenyl), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di(naphth-2-yl)anthracene (TBADN), distyrylarylene (DSA), E3 or (4,4'-bis(9-carbazolyl)-2,2-dimethyl-biphenyl (CDBP), etc., but exemplary embodiments are not limited thereto.

Examples of the dopants which may be used may include a well-known dopant. The well-known dopant may be at least one selected from fluorescent dopants and phosphorescent dopants. The phosphorescent dopants may include an organic metal complex comprising Ir, Pt, Os, Re, Ti, Zr, Hf or combination of at least two thereof, but exemplary embodiments are not limited thereto.

Examples of the well-known red dopants which may be used may include Pt(II) octaethylporphine (PtOEP), Ir(piq)$_3$ (tris(2-phenylisoquinoline)iridium), Btp$_2$Ir(acac) (bis(2-(2'-benzothienyl)-pyridinato-N,C3')iridium(acetylacetonate)), etc., but exemplary embodiments are not limited thereto.

Examples of the well-known green dopants to be used may include tris(2-phenylpyridine)iridium(Ir(ppy)$_3$), Bis(2-phenylpyridine)(Acetylacetonato)iridium(III)(Ir(ppy)$_2$(acac)), tris(2-(4-tolyl)phenylpyridine)iridium(Ir(mppy)$_3$), 10-(2-benzothiazolyl)-1,1,7,7-tetramethyl-2,3,6,7-tetrahydro-1H, 5H,11H-[1]benzopyrano[6,7,8-ij]-quinolizin-11-one (C545T), etc., but are not limited thereto.

Examples of the well-known blue dopants which may be used may include bis[3,5-difluoro-2-(2-pyridyl)phenyl](picolinato)iridium(III)(F$_2$Irpic), (F$_2$ppy)$_2$Ir(tmd), Ir(dfppz)$_3$, 4,4'-bis(2,2'-diphenylethen-1-yl)biphenyl (DPVBi), 4,4'-bis [4-(diphenylamino)styryl]biphenyl (DPAVBi), 2,5,8,11-tetra-tert-butyl perylene (TBPe), etc., but exemplary embodiments are not limited thereto.

For example, when the light emitting layer 133 includes a host and a dopant, the amount of the dopant may be conventionally in the range of about 0.01 to about 15 parts by weight relative to about 100 parts by weight of the host, but exemplary embodiments are not limited thereto.

The light emitting layer 133 may be formed by, for example, a vacuum deposition method, a spin coating method, a casting method, a Langmuir Blodgett (LB) method, etc. The thickness of the light emitting layer 133 may be in the range of, for example, about 100 Å to about 1,000 Å. For example, in an embodiment, the thickness of the light emitting layer 133 is in a range of about 200 Å to about 600 Å. When the thickness of the light emitting layer 133 is within the above-mentioned range, excellent emitting properties can be exhibited without a substantial increase in operation voltage.

For example, when the light emitting layer 133 includes a phosphorescent dopant, a hole blocking layer (HBL) (not shown) may be formed between a hole transporting layer and a light emitting layer via vacuum deposition method, spin coating method, casting method, LB method, etc., to prevent the diffusion of holes into an electron transporting layer.

Examples of compounds which may be used in the hole blocking layer may include but are not limited to oxadiazole derivatives, triazole derivatives or phenanthroline derivatives, etc. For example, BCP may be used as a material for the hole blocking layer. The thickness of the hole blocking layer (not shown) may be in the range of, for example, about 50 Å to about 1,000 Å. For example, in an embodiment, the thickness of the hole blocking layer is in the range of about 100 Å to about 300 Å.

The second organic layer 135 is formed on top of the light emitting layer 133. The second organic layer 135 may include, for example, a pattern of an electron injection layer, an electron transporting layer, a layer having a dual function of electron transporting and electron injection, or at least two layers thereof.

Examples of compounds to be used in the electron transporting layer include known compounds such as $Alq_3$, 2,9-dimethyl-4,7-diphenyl-1,10-phenanthroline (BCP), 4,7-diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), tBu-PBD (2-(4-biphenylyl)-5-(4-tert-butylphenyl)-1,3,4-oxadiazole, bis(2-methyl-8-quinolinolato-N1,O8)-(1, 1'-biphenyl-4-olato)aluminum (BAlq), beryllium bis(benzoquinolin-10-olate (Bebq$_2$)), 9,10-di(naphthalene-2-yl)anthracene (ADN), etc., but exemplary embodiments are not limited thereto.

The electron transporting layer may be formed by, for example, a vacuum a deposition method, or a spin coating method, a casting method, etc. The thickness of the electron transporting layer may be in the range of, for example, about 100 Å to about 1,000 Å.

Examples of the materials which may be used in the electron injection layer may include, for example, 8-hydroxyquinolinato lithium (LiQ), lithium fluoride (LiF), lithium oxide ($Li_2O$), sodium chloride (NaCl), sodium fluoride (NaF), potassium fluoride (KF), rubidium fluoride (RbF), cesium fluoride (CsF), francium fluoride (FrF), beryllium fluoride ($BeF_2$), magnesium fluoride ($MgF_2$), calcium fluoride ($CaF_2$), strontium fluoride ($SrF_2$), barium oxide (BaO), barium fluoride (BaF) and radium fluoride ($RaF_2$), etc., but exemplary embodiments are not limited thereto.

As in the electron transporting layer, the electron injection layer may be formed by, for example, vacuum deposition method. The thickness of the electron injection layer may be, for example, in the range of about 1 Å to about 100 Å.

In addition, the electron transporting layer and the electron injection layer may, for example, be substituted for an electron functional layer having a dual function of electron transporting and electron injection at the same time.

The second electrode 141 is formed on top of the second organic layer 135. The second electrode 141 may be formed by using, for example, a metal with low work function, an alloy, an electrically conductive compound, or combinations thereof. The second electrode 141 may be formed of, for example, Li, magnesium (Mg), aluminum (Al), aluminum-lithium (Al—Li), calcium (Ca), magnesium-indium (Mg—In), magnesium-silver (Mg—Ag), etc. In addition, the second electrode 141 may be formed into, for example, various modifications including a transmissive electrode using indium tin oxide (ITO), indium zinc oxide (IZO) zinc oxide (ZnO), aluminum doped zinc oxide (AZO), indium oxide ($In_2O_3$), tin oxide ($SnO_2$), gallium indium tin oxide (GITO), gallium indium zinc oxide (GIZO), gallium zinc oxide (GZO), and/or fluorine tin oxide (FTO).

Optionally, the first electrode 111 can be a cathode. When the first electrode 111 is a cathode, the first electrode 111 may include, for example, a material with low work function. In this case, the first electrode 111 may be formed by using, for example, aluminum (Al), sodium (Na), potassium (K), calcium (Ca), magnesium (Mg) or molybdenum aluminum (MoAl), but exemplary embodiments are not limited thereto.

When the first electrode 111 is a cathode, the first organic layer pattern 131 may include, for example, a pattern of an electron injection layer, an electron transporting layer, an electron functional layer having a dual function of electron transporting and electron injection, or at least two layers thereof. Further, the second organic layer 135 may include, for example, a pattern of a hole injection layer, a hole transporting layer, and a hole functional layer having a dual function of hole transporting and hole injection, or at least two layers thereof.

Figure 2:
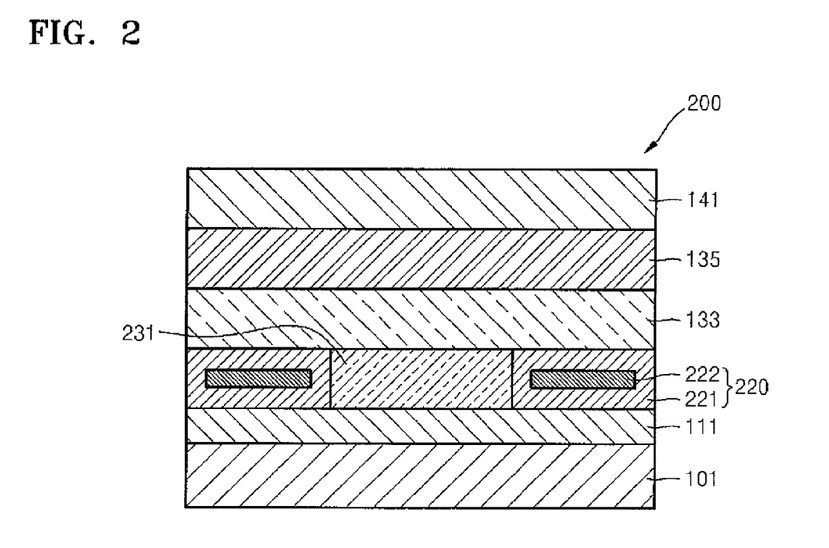
FIG. 2 is a schematic cross-sectional view of an organic light emitting device according to an exemplary embodiment of the present invention.

FIG. 2 is a schematic cross-sectional view of an organic light emitting device 200 according to an exemplary embodiment of the present invention. The main difference between the organic light emitting device 200 according to FIG. 2 and the organic light emitting device 100 according to FIG. 1 will be explained herein below.

The organic light emitting device 200 shown in FIG. 2 differs from the organic light emitting device 100 shown in FIG. 1 in that the auxiliary electrode 222 is present inside the insulation layers 221. In the case of the organic light emitting device 200 according to an embodiment of the present invention, there is no Schottky junction present because the auxiliary electrode 222 is present inside the insulation layers 221, and thus there is no contact between the first organic layer pattern 231 and the auxiliary electrode 222. As in the above embodiments, the amount of electric charge injected into the light emitting layer 133 may be increased or decreased depending on the voltage being applied to the auxiliary electrode 222 as the charge mobility in the first organic layer pattern 131 can be selectively changed by using the charges being induced by means of the electric field of the first organic layer pattern 131. In an embodiment of the present invention, the auxiliary electrode 222 may have a thickness of, for example, between about 1 nm to about 1 μm, and the auxiliary electrode pattern 220 may have a thickness of, for example, between about 1 nm to about 1 μm.

Figure 3:
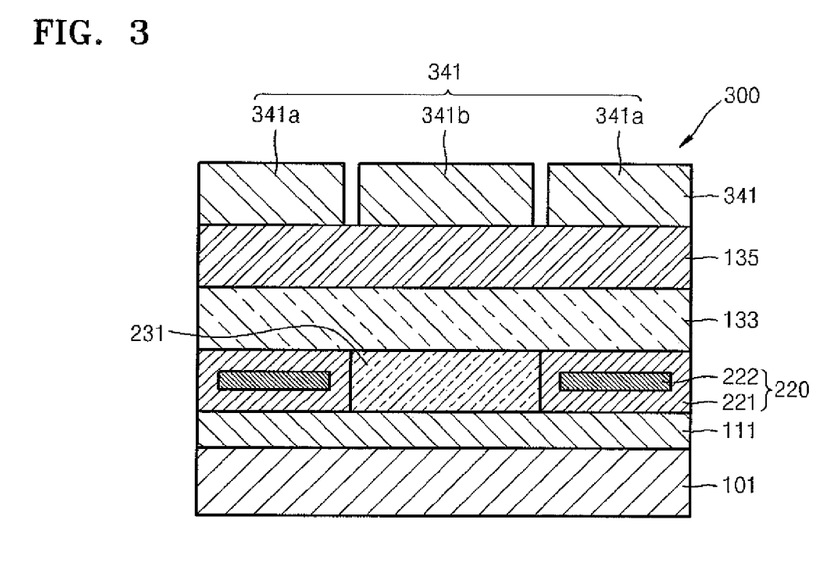
FIG. 3 is a schematic cross-sectional view of an organic light emitting device according to an exemplary embodiment of the present invention.

FIG. 3 is a schematic cross-sectional view of an organic light emitting device 300 according to an exemplary embodiment of the present invention. The main difference between the organic light emitting device 300 according to FIG. 3 and the organic light emitting device 100 according to FIG. 2 will be explained herein below. The organic light emitting device 300 shown in FIG. 3 differs from the organic light emitting device 100 shown in FIG. 2 in that a second electrode 341 of the organic light emitting device 300 includes a plurality of sub-electrodes which are insulated with each other. Referring to FIG. 3, the second electrode 341 of the organic light emitting device 300 includes, for example, an auxiliary electrode-overlapping electrode 341a, which overlaps with the auxiliary electrode 222, and a first organic layer-overlapping electrode 341b, which overlaps with the first organic layer pattern 231. Here, the auxiliary electrode-overlapping electrode 341a and the first organic layer-overlapping electrode 341b are insulated from each other. In the organic light emitting device 300, a voltage difference between the second electrode 341 and the first electrode 111 being reduced by the auxiliary electrode 222 can be cancelled off by applying a voltage greater (in absolute value) than that of the first organic layer-overlapping electrode 341b to the auxiliary electrode-overlapping electrode 341a.

Furthermore, while the auxiliary electrode 222 of the organic light emitting device 300 of FIG. 3 is present inside the insulation layer 221, the auxiliary electrode may be present on top of the insulation layer as in the case of the organic light emitting device 100.

Figure 4:
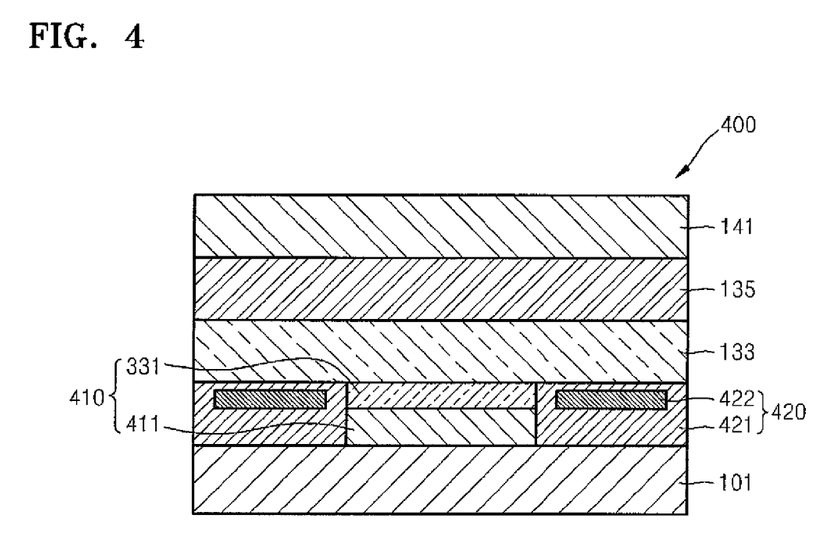
FIG. 4 is a schematic cross-sectional view of an organic light emitting device according to an exemplary embodiment of the present invention.

FIG. 4 is a schematic cross-sectional view of an organic light emitting device 400 according to an exemplary embodiment of the present invention. The main difference between the organic light emitting device 400 according to FIG. 4 and the organic light emitting device 200 according to FIG. 2 will be explained herein below.

The organic light emitting device 400 shown in FIG. 4 differs from the organic light emitting device 200 shown in FIG. 2 in that a first electrode 411 along with a first organic layer pattern 331 forms a first electrode-a first organic layer pattern 410, and is disposed between the auxiliary electrode patterns 420. In the organic light emitting device 400, the first electrode 411 may have a thickness in the range of, for example, about 1 nm to about 1 μm, and the first organic layer pattern 331 may have a thickness in the range of, for example, about 1 nm to about 1 μm. Referring to FIG. 4, because the first electrode 411 is disposed between the auxiliary electrode patterns 420, the distance between the first electrode 411 and the second electrode 141 becomes shorter, and accordingly, the electric field applied on the layers between the first electrode 411 and the second electrode 141 is elevated, thereby increasing the light emitting efficiency of the device. Also, in the present embodiment, the auxiliary electrode 422 is disposed inside the insulating layer 421.

Figure 5:
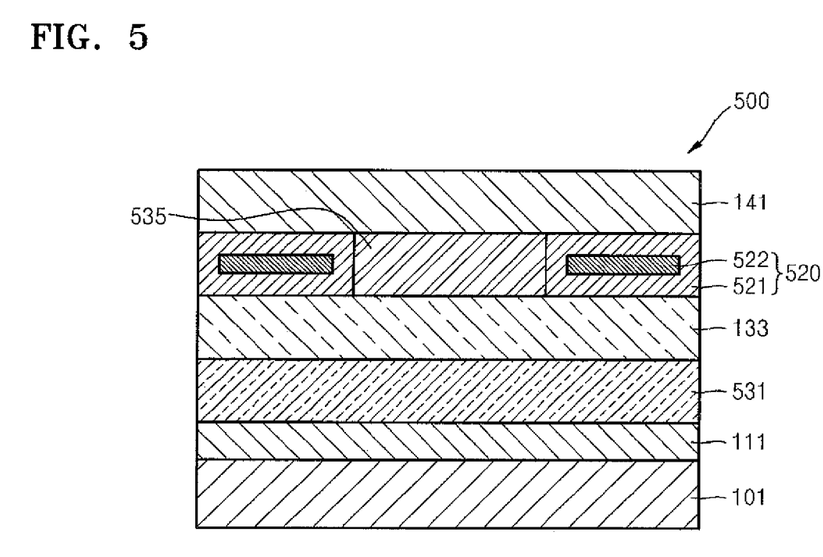
FIG. 5 is a schematic cross-sectional view of an organic light emitting device according to an exemplary embodiment of the present invention.

FIG. 5 is a schematic cross-sectional view of an organic light emitting device 500 according to an exemplary embodiment of the present invention. The main difference between the organic light emitting device 500 according to FIG. 5 and the organic light emitting device 200 according to FIG. 2 will be explained herein below.

The organic light emitting device 500 shown in FIG. 5 differs from the organic light emitting device 100 shown in FIG. 2 in that the auxiliary electrode pattern 520 is alternately disposed along with the second organic layer 535 between the light emitting layer 133 and the second electrode 141, and forms no pattern between the first electrode 111 and the light emitting layer 133. In the organic light emitting device 500, the auxiliary electrode pattern 520 disposed between the light emitting layer 133 and the second electrode 141 can control the amount of charge carriers which move within the organic light emitting device 500 by the same mechanism for the auxiliary electrode patterns 120, 220, and 420 of the organic light emitting devices 100, 200, 300, and 400 shown in FIGS. 1 to 4. That is, as the charge mobility can be changed according to the voltage applied on the auxiliary electrode 522, the light emitting amount can be increased or decreased by controlling the amount of charge in the organic light emitting device 500. Also, in the present embodiment, the first organic layer pattern 531 is disposed between the light emitting layer 133 and the first electrode 111. In addition, the auxiliary electrode 522 is disposed inside the insulating layer 521.

Figure 6:
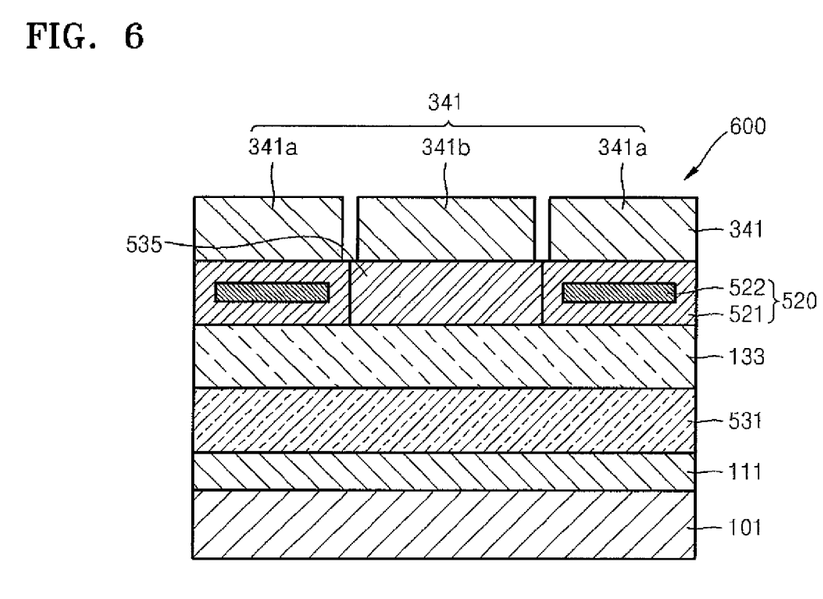
FIG. 6 is a schematic cross-sectional view of an organic light emitting device according to an exemplary embodiment of the present invention.

FIG. 6 is a schematic cross-sectional view of an organic light emitting device 600 according to an exemplary embodiment of the present invention. The main difference between the organic light emitting device 600 according to FIG. 6 and the organic light emitting device 500 according to FIG. 5 will be explained herein below.

The organic light emitting device 600 shown in FIG. 6 differs from the organic light emitting device 500 shown in FIG. 5 in that the second electrode 341 includes a plurality of subelectrodes which are insulated with each other. Referring to FIG. 6, the second electrode 341 includes, for example, an auxiliary electrode-overlapping electrode 341a, which overlaps with the auxiliary electrode 522, and a first organic layer-overlapping electrode 341b, which overlaps with a second organic layer 535. Here, the auxiliary electrode-overlapping electrode 341a and the second organic layer 535 are insulated from each other. In the organic light emitting device 600, a voltage difference between the second electrode 341 and the first electrode 111 being reduced by the auxiliary electrode 522 can be cancelled off by applying a voltage higher (in absolute value) than that of the first organic layer-overlapping electrode 341b to the auxiliary electrode-overlapping electrode 341a.

Figure 7:
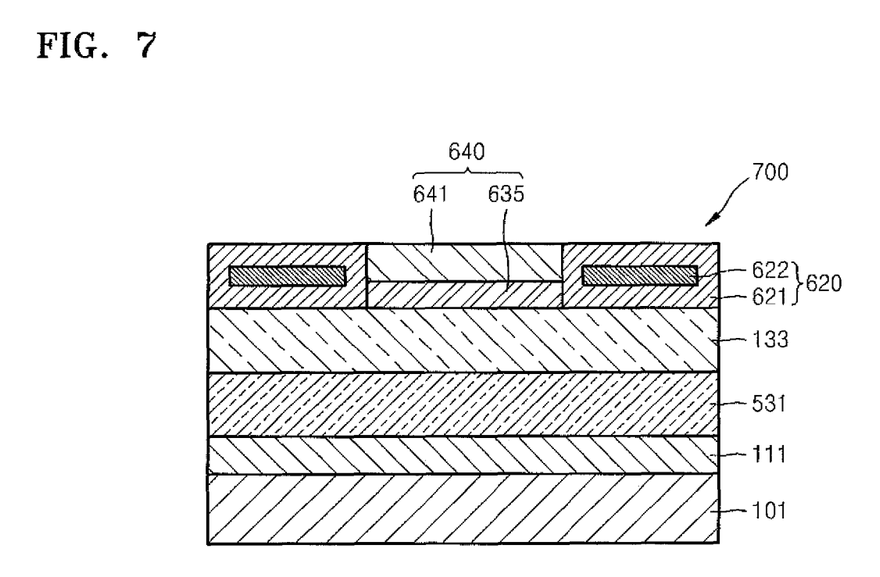
FIG. 7 is a schematic cross-sectional view of an organic light emitting device according to an exemplary embodiment of the present invention.

FIG. 7 is a schematic cross-sectional view of an organic light emitting device 700 according to an exemplary embodiment of the present invention. The main difference between the organic light emitting device 700 according to FIG. 7 and the organic light emitting device 500 according to FIG. 5 will be explained herein below.

The organic light emitting device 700 shown in FIG. 7 differs from the organic light emitting device 500 shown in FIG. 5 in that the second electrode 641 along with the second organic layer 635 forms a second electrode-a second organic layer 640 and is disposed between auxiliary electrode patterns 620. In the organic light emitting device 700, the second electrode 641 may have a thickness in the range of, for example, about 1 nm to about 1 μm, and the second organic layer 635 may have a thickness in the range of, for example, about 1 nm to about 1 μm. Referring to FIG. 7, because the second electrode 641 is disposed between the auxiliary electrode pattern(s) 620, the distance between the first electrode 111 and the second electrode 641 becomes shorter, and accordingly, the electric field applied on the layers between the first electrode 111 and the second electrode 641 is elevated, thereby increasing the light emitting efficiency of the device. Also, in the present embodiment, the auxiliary electrode 622 is disposed inside the insulating layer 621.

In exemplary embodiments, when the first electrode is a cathode and the second electrode is an anode, the first organic layer pattern or the first organic layer may include an electron injection layer, an electron transporting layer, an electron functional layer having a dual function of electron transporting and electron injection, or a pattern of at least two layers thereof. In addition, the second organic layer may include a hole injection layer, a hole transporting layer, a hole functional layer having a dual function of hole transporting and hole injection, or a pattern of at least two layers thereof.

In the organic light emitting devices according to embodiments of the present invention, there are various methods to apply a voltage to an auxiliary electrode for controlling the amount of charge carriers including a method of continuously applying a voltage while the organic light emitting device emits light, a method of applying a voltage at predetermined intervals, a method of applying a predetermined value of a voltage, a method of applying a varying value of voltages, etc. Furthermore, it is possible to use a negative or positive voltage for the purpose of increasing or decreasing the charge mobility in the organic pattern layers.

Exemplary embodiments of the present invention may be applied to organic light emitting devices with various structures including, for example, those emitting a single color, those emitting multi-colors, or those emitting a white color.

Further, exemplary embodiments of the present invention may be applied via an appropriate modification to, for example, top emission and both sided emission of organic light emitting devices as well as to bottom emission of organic light emitting devices.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An organic light emitting device comprising:
   a substrate;
   a first electrode disposed on the substrate;
   a first organic layer pattern disposed on the first electrode;
   an auxiliary electrode pattern wherein the auxiliary electrode pattern comprises a composite layer with a first gap region and the first organic layer pattern is formed in the first gap region, the composite layer of the auxiliary electrode pattern comprising an upper insulation layer, a lower insulation layer, and an auxiliary electrode disposed therebetween, wherein a bottom surface of the lower insulation layer is coplanar with a bottom surface of the first organic layer pattern;
   a light emitting layer disposed on the first organic layer pattern and the auxiliary electrode pattern;
   a second organic layer disposed on the light emitting layer; and
   a second electrode disposed on the second organic layer.

2. The organic light emitting device of claim 1, wherein the auxiliary electrode pattern is disposed on the first electrode.

3. The organic light emitting device of claim 1, wherein, in the auxiliary electrode pattern, the insulation layers are further disposed on sides of the auxiliary electrode such that the auxiliary electrode is disposed inside the insulation layers.

4. The organic light emitting device of claim 1, wherein the second electrode overlaps with a first portion of the auxiliary electrode pattern and a first organic layer overlaps a second portion of the auxiliary electrode, wherein the first portion of the auxiliary electrode pattern and the second portion of the auxiliary electrode pattern are insulated from each other.

5. The organic light emitting device of claim 1, wherein the first electrode together with the first organic layer pattern constitute a first electrode-a first organic layer pattern, wherein the first electrode-the first organic layer pattern comprises a composite layer with a second gap region and the auxiliary electrode pattern is formed in the second gap region.

6. The organic light emitting device of claim 1, wherein the first electrode together with the first organic layer pattern constitutes the first electrode-the first organic layer pattern and the auxiliary electrode pattern are disposed on the substrate.

7. The organic light emitting device of claim 1, wherein the first organic layer pattern comprises at least one selected from the group consisting of a hole transporting layer, a hole injection layer, and a layer having a dual function of hole transporting and hole injection, and wherein the second organic layer comprises at least one selected from the group consisting of an electron transporting layer, an electron injection layer, and a layer having a dual function of electron transporting and electron injection.

8. The organic light emitting device of claim 1, wherein the first organic layer pattern comprises at least one selected from the group consisting of an electron transporting layer, an electron injection layer, and a layer having a dual function of electron transporting and electron injection, and wherein the second organic layer comprises at least one selected from the group consisting of a hole transporting layer, a hole injection layer, and a layer having a dual function of hole transporting and hole injection.

9. The organic light emitting device according to claim 1, wherein an insulation layer of the upper insulation layer or the lower insulation layer comprise at least one selected from the group consisting of an oxide film or a nitride film of silicon (Si), aluminum (Al), hafnium (Hf), titanium (Ti), zirconium (Zr), or tantalum (Ta), poly(methyl methacrylate (PMMA), polyimide (PI), polyvinylpyrrolidone (PVP), polyethersulfone (PES), polystyrene (PS), poly(ester amide) (PEA).

10. The organic light emitting device according to claim 1, wherein the auxiliary electrode comprises at least one selected from the group consisting of indium tin oxide (ITO), indium zinc oxide (IZO), zinc oxide (ZnO), aluminum doped zinc oxide (AZO), indium oxide ($In_2O_3$), tin oxide ($SnO_2$), lithium (Li), magnesium (Mg), aluminum (Al), aluminum-lithium (Al—Li), calcium (Ca), magnesium-indium (Mg—In), magnesium-silver (Mg—Ag), carbon nanotbue, fullerene, gold (Au), silver (Ag), plutonium (Pu), nickel (Ni), silicon (Si), indium phosphide (InP), or gallium nitride (GaN).

11. An organic light emitting device according to claim 1, wherein an insulation layer of the upper insulation layer or the lower insulation layer and the auxiliary electrode are respectively comprised of a transparent material.

12. An organic light emitting device comprising:
    a substrate;
    a first electrode disposed on the substrate;
    a first organic layer pattern disposed on the first electrode;
    a light emitting layer disposed on the first organic layer pattern; a second organic layer disposed on the light emitting layer;
    an auxiliary electrode pattern wherein the auxiliary electrode pattern comprises a composite layer with a first gap region and the second organic layer is formed in the first gap region, the composite layer of the auxiliary electrode pattern comprising an insulation layer, and an auxiliary electrode disposed therein, wherein a bottom surface of the insulation layer is coplanar with a bottom surface of the second organic layer; and
    a second electrode disposed on the second organic layer.

13. The organic light emitting device of claim 12, wherein the second electrode overlaps with a first portion of the auxiliary electrode pattern and a second organic layer overlaps a second portion of the auxiliary electrode, wherein the first portion of the auxiliary electrode pattern and the second portion of the auxiliary electrode pattern are insulated from each other.

14. The organic light emitting device of claim 12, wherein the second electrode together with the second organic layer constitute a second electrode-a second organic layer, wherein the second electrode-the second organic layer comprises a composite layer with a second gap region and the auxiliary electrode pattern is formed in the second gap region.

15. The organic light emitting device of claim 12, wherein the first organic layer pattern comprises at least one selected from the group consisting of a hole transporting layer, a hole injection layer, and a layer having a dual function of hole transporting and hole injection, and wherein the second organic layer comprises at least one selected from the group consisting of an electron transporting layer, an electron injection layer and a layer having a dual function of electron transporting and electron injection.

16. The organic light emitting device of claim 12, wherein the first organic layer pattern comprises at least one selected from the group consisting of an electron transporting layer, an electron injection layer and a layer having the electron transporting and hole injection functions, and wherein the second organic layer comprises at least one selected from the group consisting of a hole transporting layer, a hole injection layer, and a layer having a dual function of hole transporting and hole injection.

17. An organic light emitting device comprising:
a substrate;
a first electrode disposed on the substrate;
a plurality of auxiliary electrode patterns disposed on the first electrode, and comprising an upper insulation layer, a lower insulation layer, and an auxiliary electrode disposed therebetween;
a first organic layer pattern disposed in between the plurality of auxiliary electrode patterns, wherein the first organic layer pattern contacts side surfaces of the auxiliary electrode patterns, and wherein a bottom surface of the lower insulation layer is coplanar with a bottom surface of the first organic layer pattern;
a light emitting layer disposed on an upper surface of the first organic layer pattern and the auxiliary electrode patterns;
a second organic layer disposed on an upper surface of the light emitting layer; and
a second electrode disposed on an upper surface of the second organic layer.

18. The organic light emitting device of claim 17, wherein the first organic layer pattern contacts side surfaces of the upper and lower insulation layers and the auxiliary electrodes of the auxiliary electrode patterns.

19. The organic light emitting device of claim 17, wherein both the upper insulation layer and the lower insulation layer are further formed on side surfaces of the auxiliary electrodes such that the auxiliary electrodes are disposed inside the insulating layer, and wherein the first organic layer pattern contacts sides of the insulation layers in which the auxiliary electrodes are disposed.

20. The organic light emitting device of claim 18, wherein the first electrode is disposed in between the auxiliary electrode patterns and underneath the first organic layer pattern, wherein the first electrode and the first organic layer pattern together constitute a first electrode-first organic layer pattern, and wherein the first electrode and the first organic layer pattern of the first electrode-first organic layer pattern contact sides of the insulation layer in which the auxiliary electrodes are disposed.

* * * * *